(12) United States Patent
Kim et al.

(10) Patent No.: US 10,816,596 B2
(45) Date of Patent: Oct. 27, 2020

(54) TEST CHAMBER FOR MEMORY DEVICE, TEST SYSTEM FOR MEMORY DEVICE HAVING THE SAME AND METHOD OF TESTING MEMORY DEVICES USING THE SAME

(71) Applicant: Samsung Electronics Co., Ltd., Suwon-si, Gyeonggi-do (KR)

(72) Inventors: Min-Woo Kim, Cheonan-si (KR); Chang-Ho Lee, Asan-si (KR); Jin-Ho Choi, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 102 days.

(21) Appl. No.: 16/182,148

(22) Filed: Nov. 6, 2018

(65) Prior Publication Data
US 2019/0285695 A1    Sep. 19, 2019

(30) Foreign Application Priority Data
Mar. 13, 2018  (KR) .......................... 10-2018-0028969

(51) Int. Cl.
*G01R 31/28*    (2006.01)

(52) U.S. Cl.
CPC ..... *G01R 31/2891* (2013.01); *G01R 31/2863* (2013.01); *G01R 31/2868* (2013.01); *G01R 31/2875* (2013.01); *G01R 31/2877* (2013.01)

(58) Field of Classification Search
CPC ............ G01R 31/2875; G01R 31/2868; G01R 31/2863
See application file for complete search history.

(56) References Cited

U.S. PATENT DOCUMENTS

| 7,111,211 B1 | 9/2006 | Co et al. |
| 7,170,276 B2 | 1/2007 | Park et al. |
| 8,679,958 B2 | 3/2014 | Takamure et al. |
| 8,687,356 B2 | 4/2014 | Merrow |
| 9,153,441 B2 | 10/2015 | Takamure et al. |
| 9,368,352 B2 | 6/2016 | Takamure et al. |
| 9,564,314 B2 | 2/2017 | Takamure et al. |
| 9,875,893 B2 | 1/2018 | Takamure et al. |

(Continued)

FOREIGN PATENT DOCUMENTS

| KR | 0502053 | 4/2004 |
| KR | 0505073 | 7/2004 |

(Continued)

*Primary Examiner* — Alvaro E Fortich
(74) *Attorney, Agent, or Firm* — Myers Bigel, P.A.

(57) ABSTRACT

A test system for a memory device includes: a chamber including at least one test socket column having a plurality of test sockets arranged in a first direction, wherein memory devices to be tested are in respective ones of the plurality of test sockets, a temperature adjusting apparatus configured to supply air into the chamber according to a temperature control signal to control a temperature of the chamber, a test device electrically connected to the test sockets and configured to test the memory devices, and a temperature controller configured to receive temperature information of the memory devices from temperature sensors of the memory devices and to output to the temperature adjusting apparatus the temperature control signal to compensate for a temperature difference between a detected temperature of the memory devices and a target temperature.

20 Claims, 10 Drawing Sheets

(56) References Cited

U.S. PATENT DOCUMENTS

| | | | | |
|---|---|---|---|---|
| 2002/0056057 A1* | 5/2002 | Co | ............... | G01R 31/31905 |
| | | | | 714/42 |
| 2002/0121913 A1* | 9/2002 | Miller | ............ | G01R 31/2874 |
| | | | | 324/750.05 |
| 2006/0197546 A1* | 9/2006 | Co | ...................... | G11C 29/56 |
| | | | | 324/750.05 |
| 2013/0223475 A1* | 8/2013 | Yoon | .................. | G11C 29/06 |
| | | | | 374/57 |
| 2014/0254251 A1* | 9/2014 | Lee | ............. | G11C 29/56016 |
| | | | | 365/158 |

FOREIGN PATENT DOCUMENTS

| | | |
|---|---|---|
| KR | 0887730 | 3/2009 |
| KR | 0909948 | 3/2009 |
| KR | 20090102007 | 9/2009 |
| KR | 1191309 | 10/2012 |
| KR | 20130049752 | 5/2013 |
| KR | 1774364 | 8/2017 |
| KR | 1796013 | 11/2017 |

\* cited by examiner

TEST CHAMBER FOR MEMORY DEVICE, TEST SYSTEM FOR MEMORY DEVICE HAVING THE SAME AND METHOD OF TESTING MEMORY DEVICES USING THE SAME

PRIORITY STATEMENT

This application claims priority under 35 U.S.C. § 119 to Korean Patent Application No. 10-2018-0028969, filed on Mar. 13, 2018 in the Korean Intellectual Property Office (KIPO), the contents of which are hereby incorporated by reference herein in their entirety.

BACKGROUND

Example embodiments relate to a test chamber for a memory device, a test system for memory device having the same and a method of testing memory devices using the same. More particularly, example embodiments relate to a test chamber for a memory device that performs an aging test of memory devices such as SSDs, a test system for memory device having the same and a method of testing memory devices using the same.

An aging test of memory devices such as SSDs may include read and write test programs, and when the test is performed, the memory devices may be heated. Because the heating value of the memory device is different according to test entries, it may be required that the test programs are performed repeatedly under a same temperature condition.

SUMMARY

Example embodiments provide a test system for a memory device capable of providing reliable test results.

Example embodiments provide a test chamber for the test system.

Example embodiments provide a method of testing memory devices using the test system.

According to example embodiments, a test system for a memory device includes: a chamber including at least one test socket column having a plurality of test sockets arranged in a first direction, wherein memory devices to be tested are in respective ones of the plurality of test sockets, a temperature adjusting apparatus configured to supply air into the chamber according to a temperature control signal to control a temperature of the chamber, a test device electrically connected to the test sockets and configured to test the memory devices, and a temperature controller configured to receive temperature information of the memory devices from temperature sensors of the memory devices and to output to the temperature adjusting apparatus the temperature control signal to compensate for a temperature difference between a detected temperature of the memory devices and a target temperature.

According to example embodiments, a test system for a memory device includes: a chamber including at least one test socket column having a plurality of test sockets arranged in a first direction, wherein memory devices to be tested are in respective ones of the plurality of test sockets, a temperature adjusting apparatus configured to supply a first air into the chamber according to a temperature control signal to control a temperature of the chamber, at least one air spray nozzle extending in the first direction at a side of the at least one test socket column and having a plurality of spray holes along the first direction and configured to spray a second air toward the memory devices, a test device electrically connected to the test sockets and configured to test the memory devices, and a temperature controller configured to receive temperature information of the memory devices from temperature sensors of the memory devices and to output to the temperature adjusting apparatus the temperature control signal to compensate for a temperature difference between a detected temperature of the memory devices and a target temperature.

According to example embodiments, a test chamber for a memory device includes: a chamber within a housing to provide a test space, and including a first sidewall having an air inlet formed therein, a second sidewall opposite to the first sidewall and having an air outlet formed therein and a third sidewall connecting the first and second sidewalls, wherein at least one test socket column having a plurality of test sockets is installed in or on the third sidewall, memory devices to be tested being inserted into the test sockets, a temperature adjusting apparatus installed within the housing, and configured to circulate an air throughout the chamber through the air inlet and the air outlet according to an inputted temperature control signal to control a temperature of the chamber, and at least one air spray nozzle extending in the first direction in a side of the test socket column and having a plurality of spray holes formed along an extending direction of the air spray nozzle to spray out a second air toward the memory device.

According to example embodiments, in a method of testing memory devices, the memory devices are inserted into respective ones of a plurality of test sockets arranged in a first direction within a test chamber. A test program of the memory devices is performed. Temperature information of the memory devices is detected from temperature sensors of the memory devices. A temperature of the test chamber is adjusted to compensate for a temperature difference between a detected temperature of the memory devices and a target temperature.

According to example embodiments, a test system for a memory device may include a convection chamber including at least one test socket column having a plurality of test sockets, into which memory devices are inserted, arranged in a first direction, and a temperature adjusting apparatus configured to supply an air into the chamber according to an inputted temperature control signal to adjust a temperature of the chamber. The test system for a memory device may detect temperature information of the memory devices on which a test is performed, and may output the temperature control signal to the temperature adjusting apparatus to adjust the temperature of the chamber in order to compensate a temperature difference between the detected temperature of the memory device and a target temperature.

Accordingly, even when a heating value of the memory device is relatively high or low according to test entries, the temperature information of the memory device may be detected and then the memory device may be tested at a the target temperature.

Further, the test system for a memory device may further include an air spray nozzle provided in a side of the test socket column to extend in the first direction and having a plurality of spray holes formed along an extending direction of the air spray nozzle to spray an air toward the memory devices.

Accordingly, uniformity of heat convection within the chamber may be improved to reduce a temperature difference between the memory devices.

BRIEF DESCRIPTION OF THE DRAWINGS

Example embodiments will be more clearly understood from the following detailed description taken in conjunction

DETAILED DESCRIPTION OF EXAMPLE EMBODIMENTS

Hereinafter, example embodiments will be explained in detail with reference to the accompanying drawings. As used herein the expression "and/or" includes any and all combinations of one or more of the associated listed items.

Figure 1:
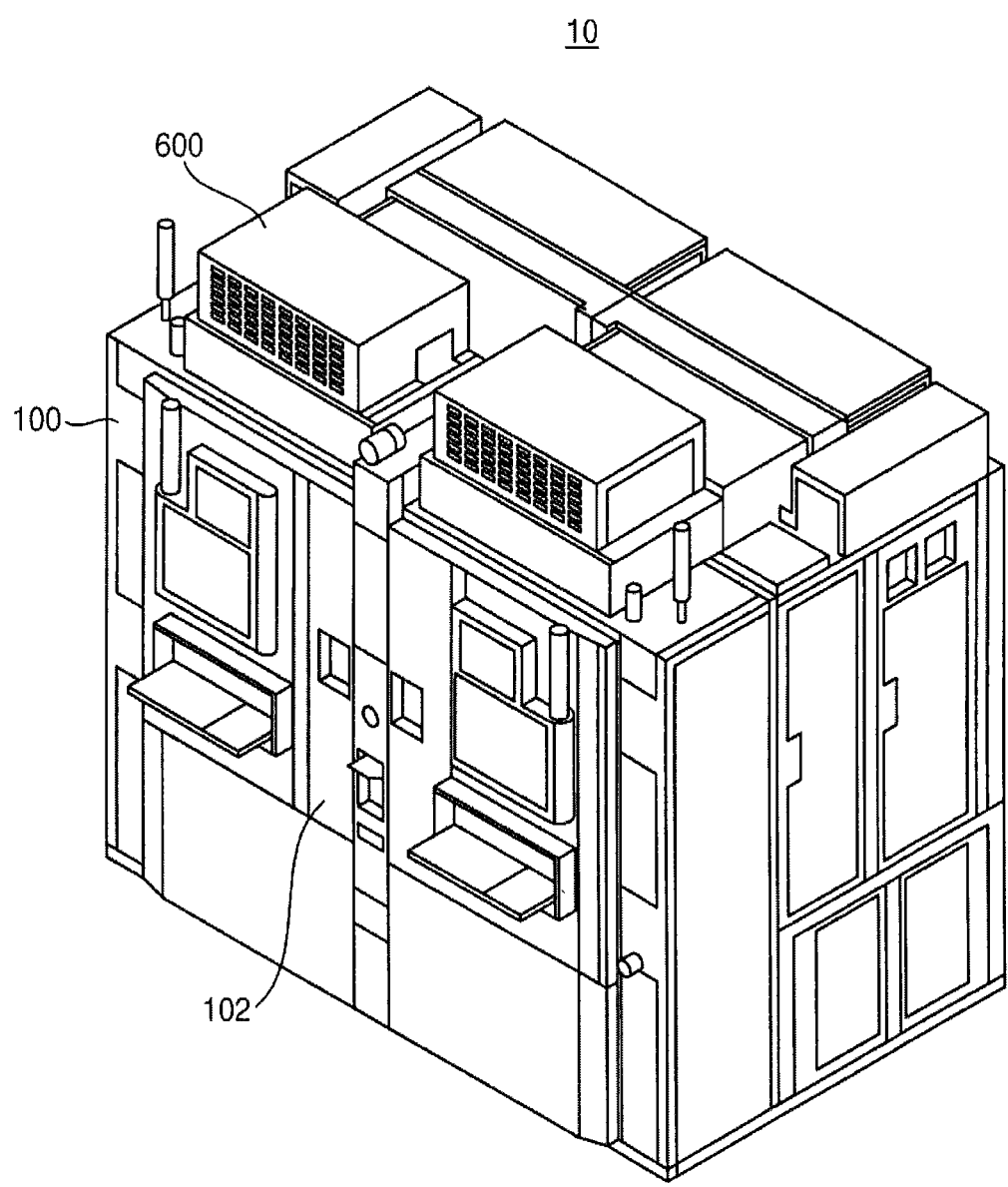
FIG. 1 is a perspective view illustrating a test system for a memory device in accordance with example embodiments.
Figure 2:
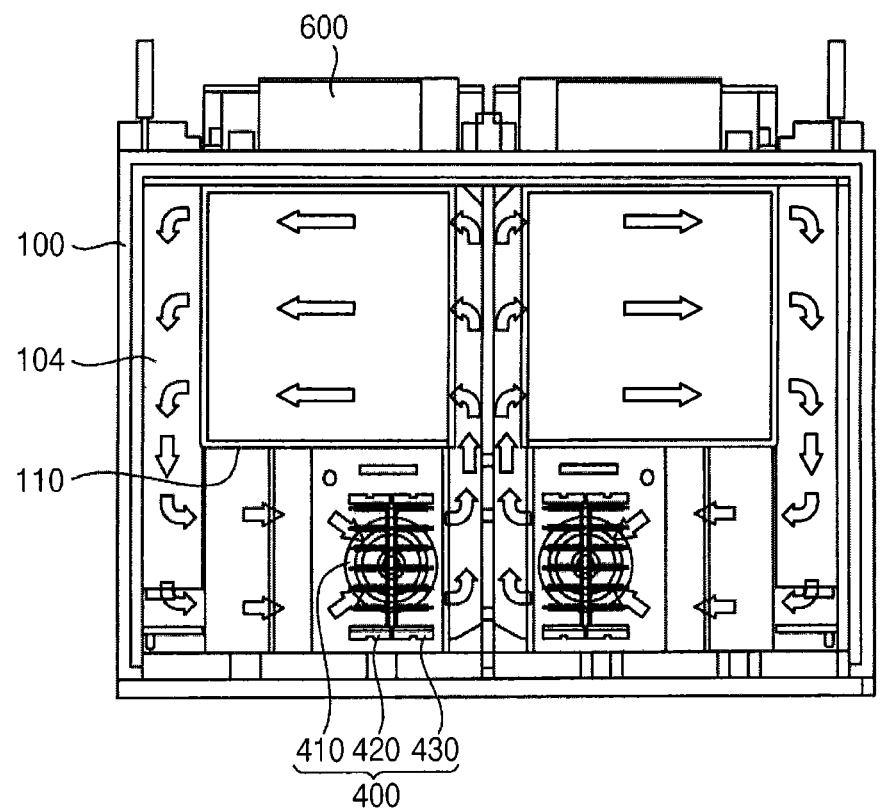
FIG. 2 is a front view illustrating the test system in FIG. 1.
Figure 3:
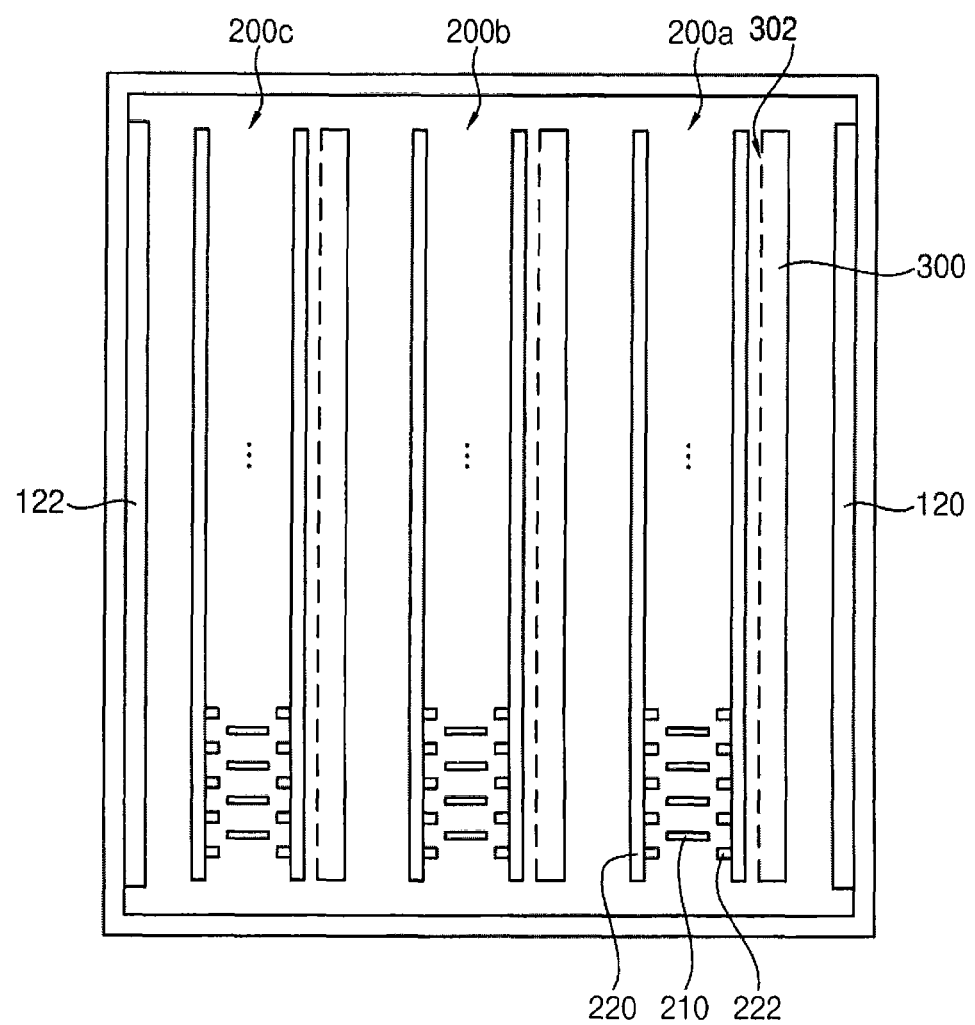
FIG. 3 is a front view illustrating a chamber of the test system in FIG. 1.
Figure 4:
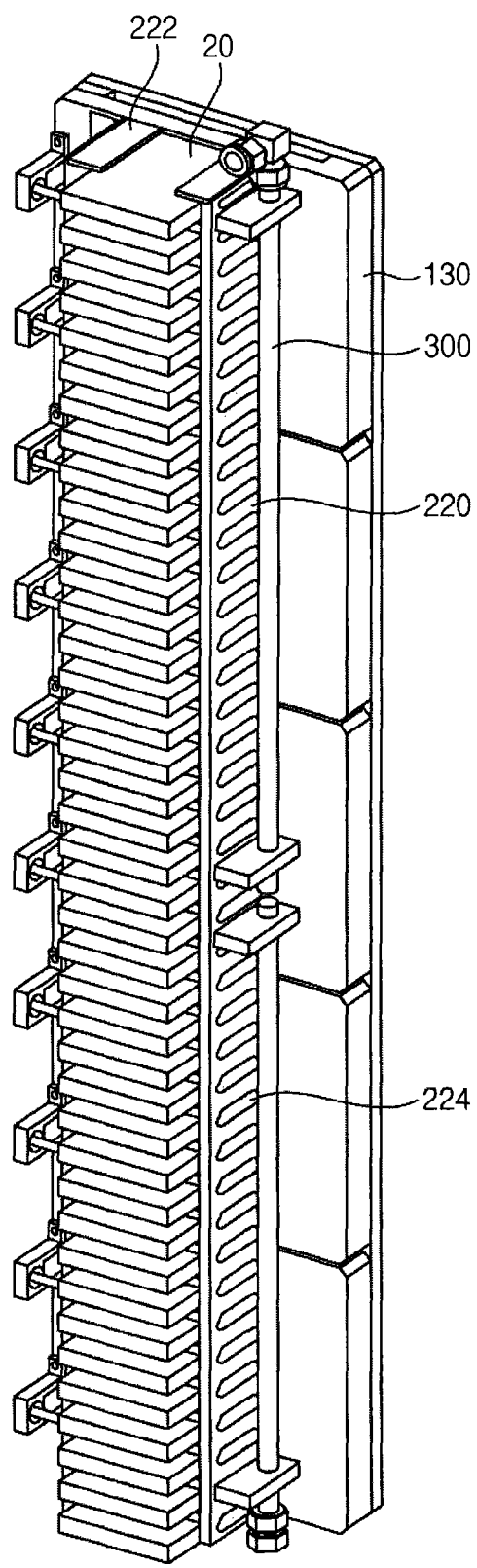
FIG. 4 is a perspective view illustrating a test socket column and an air spray nozzle within the chamber in FIG. 3.
Figure 5:
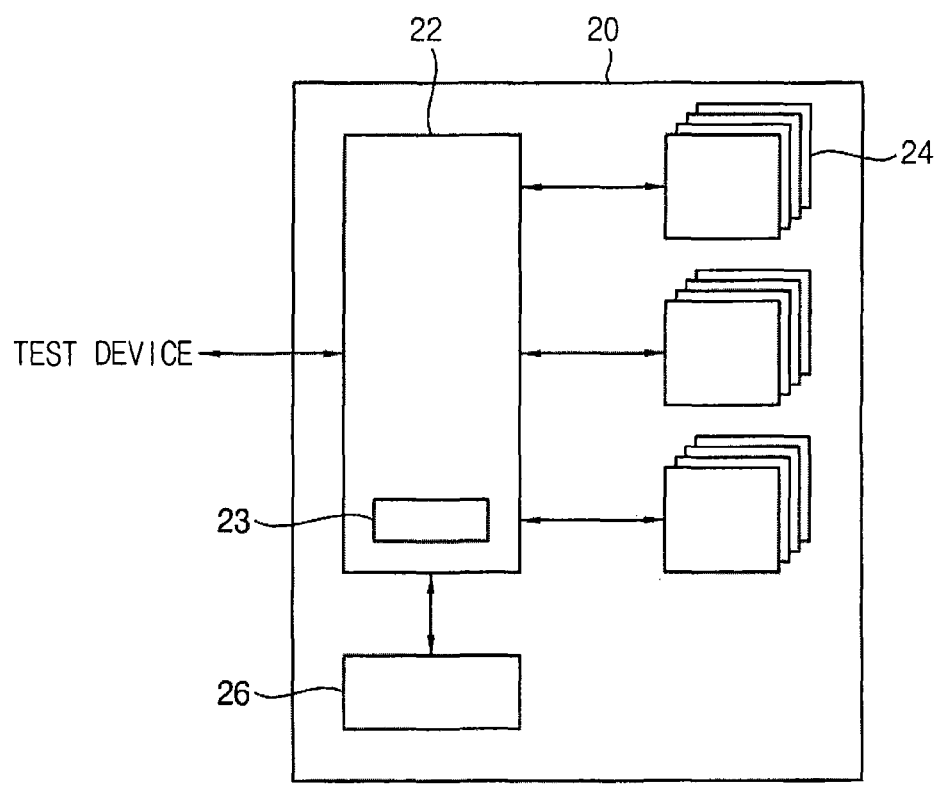
FIG. 5 is a block diagram illustrating a semiconductor device inserted into a test socket within the test chamber in FIG. 3.
Figure 6:
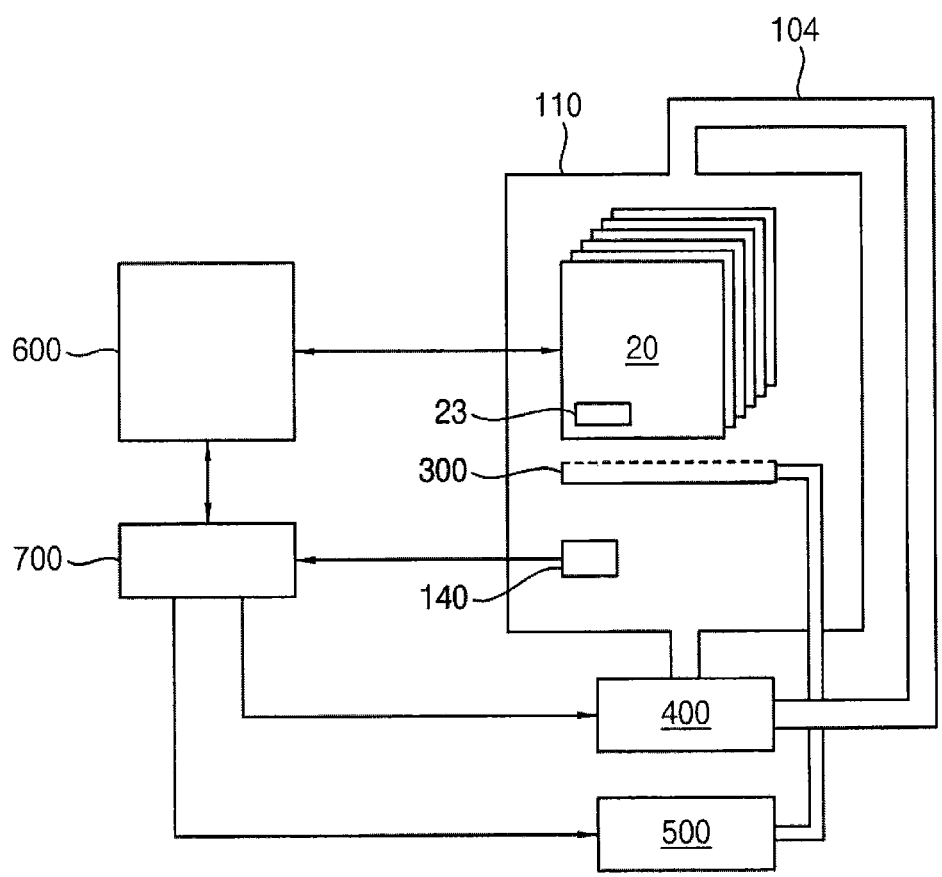
FIG. 6 is a block diagram illustrating the test system for a memory device in FIG. 1.
Figure 7:
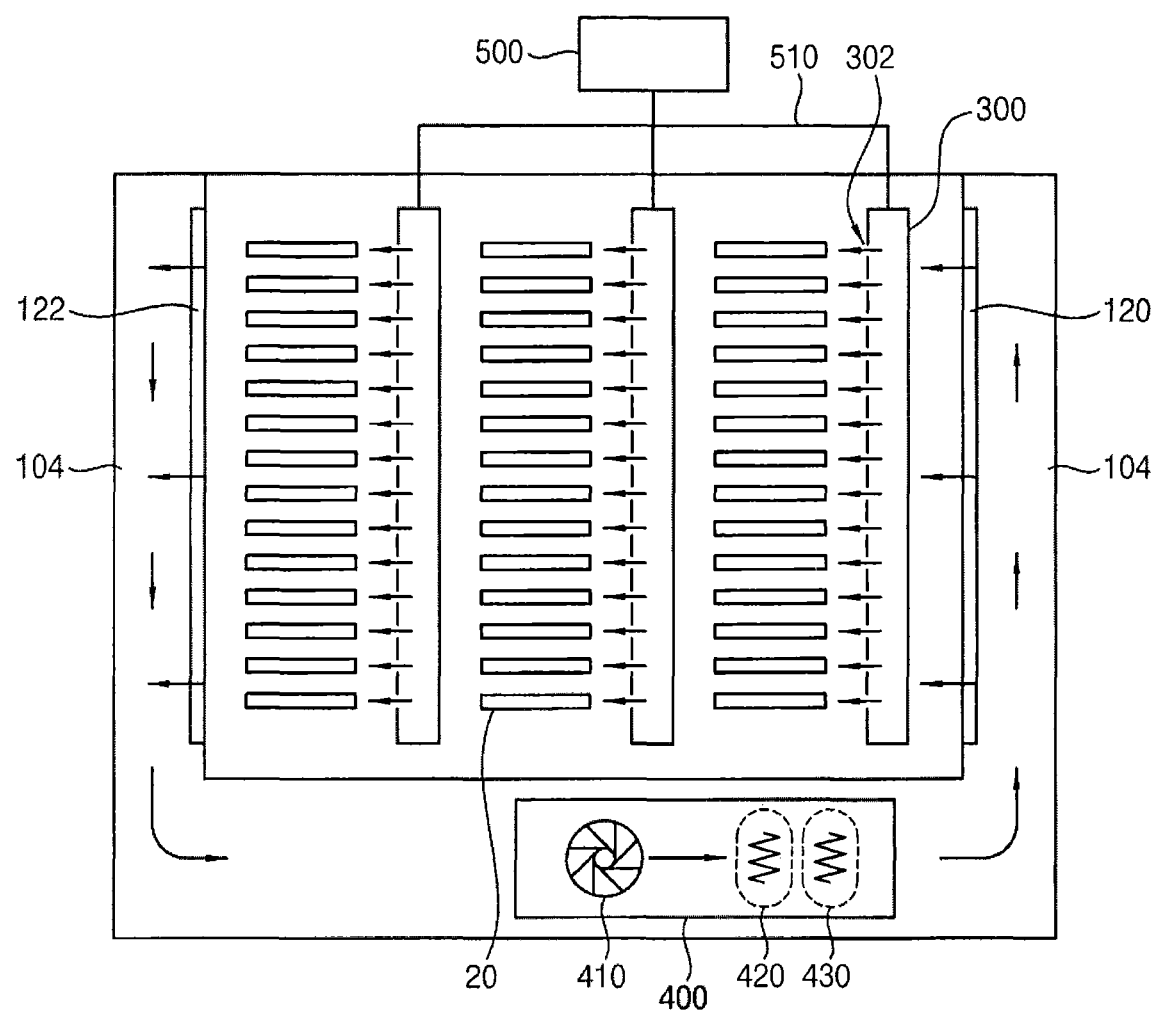
FIG. 7 is a view illustrating an air flow within the test system in FIG. 2.
Figure 8:
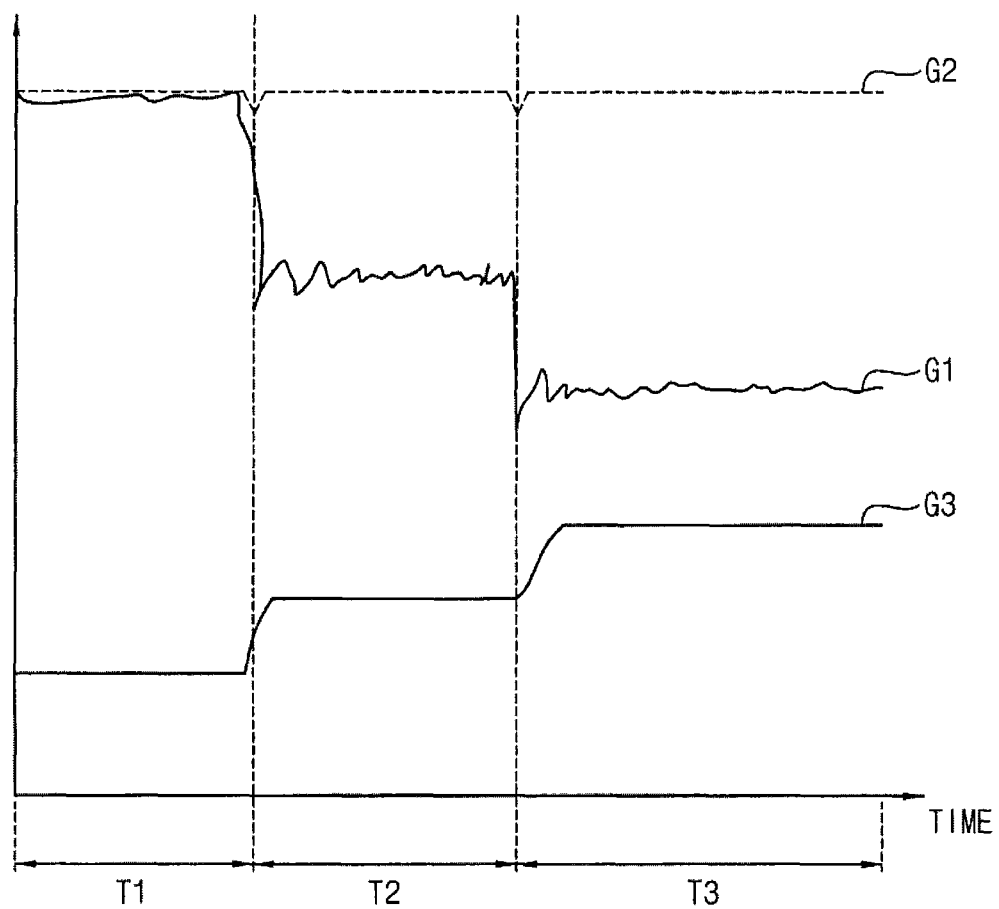
FIG. 8 is a graph illustrating temperature changes in the memory device and the chamber during test for the memory device in accordance with an example embodiment.
Figure 9:
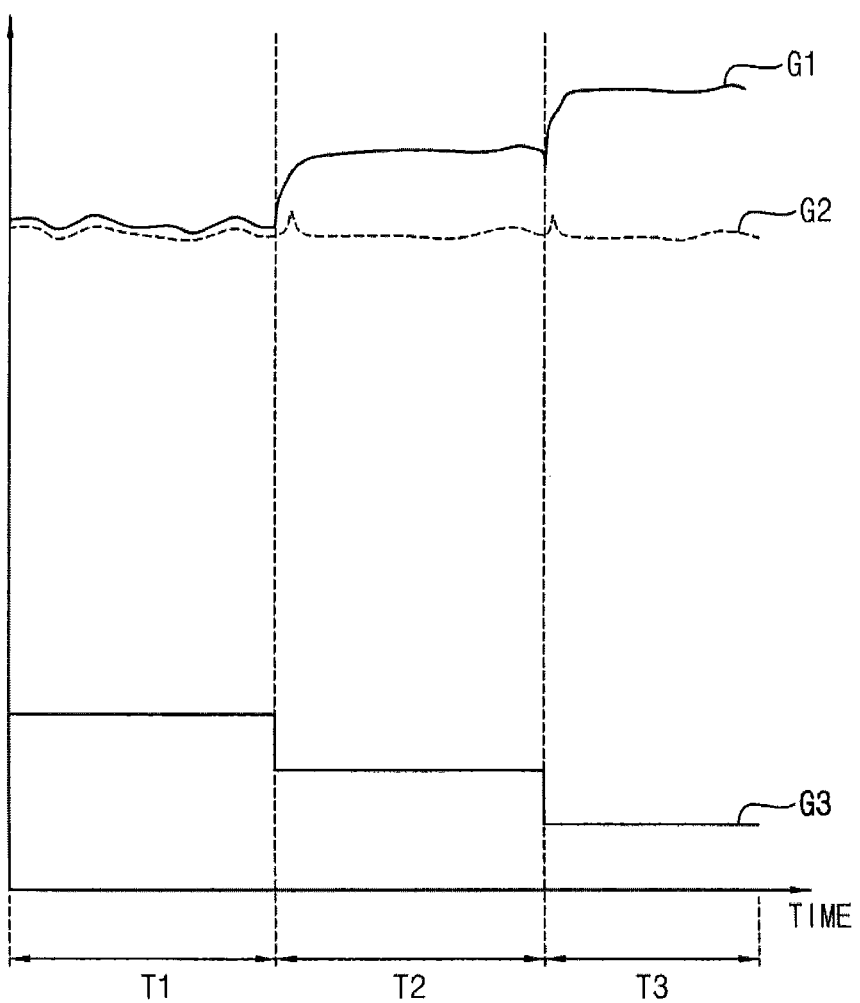
FIG. 9 is a graph illustrating temperature changes in the memory device and the chamber during test for the memory device in accordance with another example embodiment.

FIG. 1 is a perspective view illustrating a test system for a memory device in accordance with example embodiments. FIG. 2 is a front view illustrating the test system in FIG. 1. FIG. 3 is a front view illustrating a chamber of the test system in FIG. 1. FIG. 4 is a perspective view illustrating a test socket column and an air spray nozzle within the chamber in FIG. 3. FIG. 5 is a block diagram illustrating a semiconductor device inserted into a test socket within the test chamber in FIG. 3. FIG. 6 is a block diagram illustrating the test system for a memory device in FIG. 1. FIG. 7 is a view illustrating an air flow within the test system in FIG. 2. FIG. 8 is a graph illustrating temperature changes in the memory device and the chamber during test for the memory device in accordance with an example embodiment. FIG. 9 is a graph illustrating temperature changes in the memory device and the chamber during test for the memory device in accordance with another example embodiment.

Referring to FIGS. 1 to 9, a test system for a memory device 10 may include a test chamber within a housing 100, a temperature adjusting apparatus 400, a test device 600 and a temperature controller 700. The test system for a memory device may further include an air spray device including an air spray nozzle 300.

In example embodiments, the test system 10 may be aging inspection equipment which tests a plurality of memory devices at once. The memory device 20 may be or include a non-volatile memory device. For example, the memory device may be or include a solid state disk (SSD).

As illustrated in FIGS. 2, 3 and 7, the test chamber may include a chamber 110 providing a test space within the housing 100. The chamber 110 may include first and second sidewalls opposite to each other and a third sidewall (which may also be referred to as a back or rear wall) connecting the first and second sidewalls. A front opening of the chamber 110 may be opened and closed by a door 102. The chamber 110 may include a lower or bottom wall and an opposite upper or top wall (which may be defined by the system housing in some embodiments).

The third sidewall may include a backplane 130. At least one test socket column may be installed in or on the backplane 130 of the third sidewall. The test socket column may include test sockets 210 arranged in a first direction (e.g., vertical direction). The memory device 20 may be inserted into the test socket 210 to be tested.

The test socket column may include a pair of socket guides 222 which guides and supports the memory device 20 inserted into the test socket 210. The pair of socket guides 222 may be provided in or on a pair of guide columns 220 which extends in the first direction. A plurality of slits 224 may be formed to be spaced apart from each other along the extending direction (e.g., the first direction) of the guide column 220. As mentioned below, a fluid such as air may flow through the slits 224, thereby enhancing heat transfer between the memory devices 20.

First, second and third test socket columns 200a, 200b, 200c may be installed to be spaced apart from each other in a direction perpendicular to the first direction between the first and second sidewalls. For example, one test socket column may include 40 to 80 test sockets 210.

A first plate 120 having an air inlet formed therein may be provided in the first sidewall of the chamber 110, and a second plate 122 having an air outlet formed therein may be provided in the second sidewall of the chamber 110. Air flowing ducts 104 may be provided between the first sidewall of the chamber 110 and an inner wall of the housing 100 opposite to each other, between the second sidewall of the chamber 110 and an inner wall of the housing 100 opposite to each other, and between a bottom wall of the chamber 110 and a bottom wall of the housing 100 opposite to each other.

The temperature adjusting apparatus 400 may circulate air within the chamber 110 through the air flowing ducts 104 to adjust the temperature of the chamber 110. The temperature adjusting apparatus 400 may supply the air into the chamber 110 according to a temperature control signal input from the temperature controller 700 to adjust the temperature of the chamber 110.

In particular, the temperature adjusting apparatus 400 may include a blower fan 410 configured to blow the air into the chamber 110 and a heater 420 configured to heat the air. For example, the air heated by the heater 420 may flow through the air flowing duct 104 and then may be supplied into the chamber 110 through the air inlet, and the air within the chamber 110 may be discharged through the air outlet and then may return to the air flowing duct 104.

Additionally, the temperature adjusting apparatus 400 may further include a cooler 430 configured to cool the air. For example, the air cooled by the cooler 430 may flow through the air flowing duct 104 and then may be supplied to the chamber 110 through the air inlet, and the air within the chamber 110 may be discharged through the air outlet and then may return to the air flowing duct 104.

The blower fan, the heater and the cooler may be arranged sequentially along the air flowing direction between the bottom wall of the chamber 110 and the bottom wall of the housing 100 opposite to each other. It will be understood that the arrangement of the blower fan, the heater and the cooler may not be limited thereto.

The air spray device may include the air spray nozzle 300 which extends in the first direction in or along a side of the test socket column. A plurality of spray holes 302 may be formed to be spaced apart from each other along a length or the extending direction (e.g., first direction) of the air spray nozzle 300. The air spray nozzle 300 may be arranged in or on the right side of the test socket column when seen from the front view. The air spray nozzle 300 may be arranged upstream of the air flow. The spray holes 302 may be arranged corresponding to or aligned with the slits 224 of the guide column 220.

The air spray device may include a gas supply or gas supply portion 500 configured to supply a gas such as air to the air spray nozzle 300. For example, the gas supply portion 500 may supply the air to the air spray nozzle 300 through an air tube 510.

The spray hole 302 may be formed to extend at a predetermined angle with respect to the extending direction of the air spray nozzle 300. For example, the spray hole 302 may extend in a direction perpendicular to the extending direction of the air spray nozzle 300 (e.g., horizontal). Accordingly the air spray nozzle 300 may sprayed out the air through the spray hole 302 toward the memory devices inserted into the test socket column.

First, second and third air spray nozzles 300 may be installed between the first and second sidewalls to be spaced apart from each other in a direction perpendicular to the first direction. The first, second and third spray nozzles 300 may be arranged adjacent to the first, second and third test socket columns 200a, 200b, 200c, respectively.

The first, second and third air spray nozzles 300 may smooth the air flow within the chamber 110 to thereby improve uniformity of heat transfer distribution within the chamber 110. Thus, a temperature difference between the memory devices 20 may be reduced.

The test device 600 may be electrically connected to the test sockets 210 to perform a test program for testing the memory devices 20. The test device 600 may perform repeatedly read and write test programs under a same temperature condition (for example, target temperature).

When the test program of the memory device is performed, the memory device may be heated. For example, the memory device may be heated to a first temperature when a first test program (for example, write test program) is performed, while the memory device may be heated to a second temperature higher than the first temperature when a second test program (for example, read test program) is performed.

The memory device 20 to be tested may include a temperature sensor 23 for detecting a temperature of the memory device 20. For example, the memory device 20 may be SSD. As illustrated in FIG. 5, the memory device 20 may include an SSD controller 22, a plurality of non-volatile memory devices 24 and a buffer memory device 26. The temperature sensor 23 may be provided in the SSD controller 22. Alternatively, the temperature sensor 23 may be provided in each of the memory devices 24. The SSD controller 22 may communicate signals with the test device 600. Here, the signal transmitted between the SSD controller 22 and the test device 600 may include command, address, data, etc. The test device 600 may receive temperature information of the memory device 20 from the temperature sensor 23.

The temperature controller 700 may receive the temperature information of the memory devices 20 from the temperature sensors 23 of the memory devices 20, and may output to the temperature adjusting apparatus 400 the temperature control signal to compensate for a temperature difference between the detected temperature of the memory device 20 and the target temperature.

The temperature controller 700 may be connected to or communicate with the test device 600 to receive the temperature information of the memory devices 20. Alternatively, the temperature controller 700 may be connected to or communicate with the temperature sensors 23 of the memory devices 20 to receive the temperature information of the memory devices 20.

The temperature controller 700 may determine any one of an average value, a minimum value and a maximum value of the received detected temperature of the memory devices 20 as a representative detected temperature. The temperature controller 700 may compare the representative detected temperature with the target temperature of the memory device 20 to output the temperature control signal to compensate for the temperature difference to the temperature adjusting apparatus 400. For example, the temperature controller 700 may include programmable logic controller (PLC).

In example embodiments, the test system for a memory device 10 may further include a plurality of chamber temperature sensors 140 within the chamber 110. The temperature controller 700 may receive temperature information within the chamber 110 from the chamber temperature sensor 140 in real time. The temperature controller 700 may control the temperature within the chamber 110 using the temperature adjusting apparatus 400 based on the temperature information of the chamber.

Referring to FIG. 8, line G1 represents a temperature of the memory device 20 when the temperature adjusting device 400 is not used, line G2 represents a temperature of the memory device 20 when the temperature adjusting device 400 is used, and line G3 represents a temperature within the chamber 110.

When the test device 600 performs a first test program T1, the memory device 20 may be heated to be maintained at a predetermined temperature (for example, 75° C.). Here, the temperature of the chamber 110 may be maintained at a first temperature (for example, 35° C.).

When the test device 600 performs a second test program T2, the memory device 20 may be maintained at a temperature lower than the predetermined temperature. Here, the temperature controller 700 may output to the temperature adjusting apparatus 400 a first temperature control signal to compensate for a temperature difference between the detected temperature of the memory device 20 and the predetermined temperature, and the temperature adjusting apparatus 400 may increase the temperature of the chamber 110 to a second temperature (for example, 45° C.) higher than the first temperature, to thereby maintain the memory device 20 at the predetermined temperature.

When the test device 600 performs a third test program T3, the memory device 20 may be maintained at a temperature lower than the predetermined temperature. Here, the temperature controller 700 may output to the temperature adjusting apparatus 400 a second temperature control signal to compensate for a temperature difference between the detected temperature of the memory device 20 and the predetermined temperature, and the temperature adjusting apparatus 400 may increase the temperature of the chamber 110 to a third temperature (for example, 55° C.) higher than the second temperature, to thereby maintain the memory device 20 at the predetermined temperature.

Referring to FIG. 9, line G1 represents a temperature of the memory device 20 when the temperature adjusting device 400 is not used, line G2 represents a temperature of the memory device 20 when the temperature adjusting device 400 is used, and line G3 represents a temperature within the chamber 110.

When the test device 600 performs a first test program T1, the memory device 20 may be heated to be maintained at a predetermined temperature (for example, 75° C.). Here, the temperature of the chamber 110 may be maintained at a first temperature (for example, 35° C.).

When the test device 600 performs a second test program T2, the memory device 20 may be maintained at a temperature higher than the predetermined temperature. Here, the temperature controller 700 may output to the temperature adjusting apparatus 400 a third temperature control signal to compensate for a temperature difference between the detected temperature of the memory device 20 and the predetermined temperature, and the temperature adjusting apparatus 400 may decrease the temperature of the chamber 110 to a fourth temperature (for example, 30° C.) lower than the first temperature, to thereby maintain the memory device 20 at the predetermined temperature.

When the test device 600 performs a third test program T3, the memory device 20 may be maintained at a temperature higher than the predetermined temperature. Here, the temperature controller 700 may output to the temperature adjusting apparatus 400 a fifth temperature control signal to compensate for a temperature difference between the detected temperature of the memory device 20 and the predetermined temperature, and the temperature adjusting apparatus 400 may decrease the temperature of the chamber 110 to a fifth temperature (for example, 25° C.) lower than the fourth temperature, to thereby maintain the memory device 20 at the predetermined temperature.

As mentioned above, the test system for a memory device 10 may include the convection chamber 110 including at least one test socket column 200 having a plurality of the test sockets 210, into which the memory devices 20 are respectively inserted, arranged in the first direction, and the temperature adjusting apparatus 400 configured to supply the air into the chamber 110 according to a temperature control signal to adjust the temperature of the chamber 110. The test system for a memory device 10 may detect the temperature information of the memory devices 20 on which a test program is performed, and may output the temperature control signal to the temperature adjusting apparatus 400 to adjust the temperature of the chamber 110 in order to compensate for a temperature difference between the detected temperature of the memory device 20 and the target temperature.

Accordingly, even when the heating value of the memory device 20 is relatively high or low according to test entries, the temperature information of the memory device 20 may be detected and then the memory device 20 may be tested at a desired temperature.

Further, the test system for a memory device 10 may further include the air spray nozzle 300 provided in or to the side of the test socket column 200 to extend in the first direction and having a plurality of the spray holes formed along the extending direction (e.g., first direction) of the air spray nozzle 300 to spray the air toward the memory devices 20.

Accordingly, uniformity of heat convection within the chamber 110 may be improved to reduce a temperature difference between the memory devices 20.

Hereinafter, a method of testing memory devices using the test system for a memory device of FIG. 1 may be explained. The test method of the memory devices may be applied for an aging test of SSD. However, it may not be limited thereto, and it will be understood that the test method may be used for an inspection process of testing a semiconductor device at a specific temperature.

Figure 10:
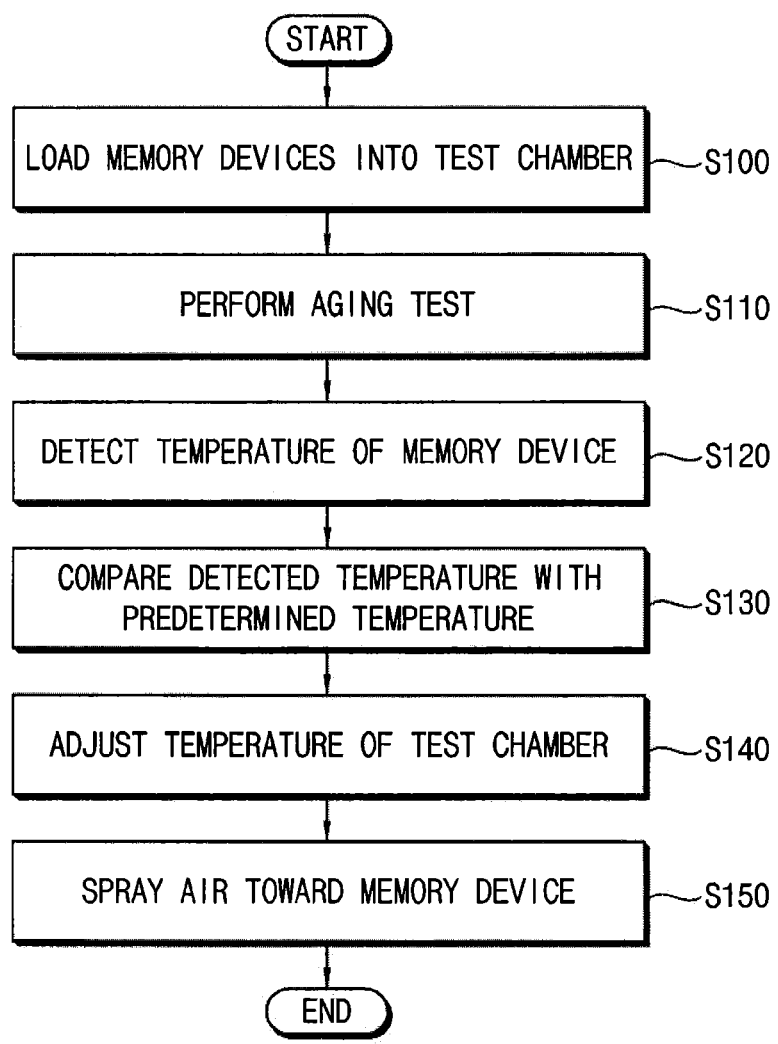
FIG. 10 is a flowchart illustrating a method of testing memory devices in accordance with example embodiments.

FIG. 10 is a flowchart illustrating a method of testing memory devices in accordance with example embodiments.

Referring to FIG. 10, first, memory devices 20 may be loaded into a test chamber (S100).

In example embodiments, electronic components 22, 24, 26 (see FIG. 5) may be mounted on a module board and then packaged to form the memory devices 20, and then, the memory devices 20 may be inserted into a plurality of test sockets 210 arranged in a first direction within the test chamber 110.

The module board may have a rectangular or square shape. The module board may have a first side portion and a second side portion opposite to each other. A connector provided in the first side portion of the module board may be inserted into the test socket 210.

In example embodiments, the memory device 20 may include an SSD controller 22, non-volatile memory devices 24 and a buffer memory device 26. The electronic components may be mounted on the module board to be provided as a solid state drive (SSD). The SSD may be used to replace a hard disk in a PC, notebook, etc. The SSD may be used in a mobile device such as smart phone, tablet PC, digital camera, MP3 player, PDA, etc.

Substrate pads may be arranged on an upper surface or a lower surface of the module board. A solder paste may be coated on the substrate pads by a screen printing method, and then solders on input/output pads of the SSD controller 22, the non-volatile memory devices 24 and the buffer memory device 26 may contact the solder paste. Then, a reflow process may be performed on the solders to form solder bumps such that the substrate pads and the input/output pads are mechanically and electrically connected to each other. Then, an underfill process may be performed to form the memory device 20.

Then, aging test programs may be performed on the memory devices 20 (S110), and then, temperature information of the memory devices 20 may be detected (S120).

In example embodiments, read and write test programs may be performed repeatedly under a same temperature condition (for example, target temperature). When the test program of the memory device is performed, the memory device may be heated. For example, the memory device may be heated to a first temperature when a first test program (for example, write test program) is performed, while the memory device may be heated to a second temperature higher than the first temperature when a second test program (for example, read test program) is performed.

The memory device 20 to be tested may include a temperature sensor 23 for detecting a temperature of the memory device 20. The temperature sensor 23 may be provided in the SSD controller 22. Alternatively, the temperature sensor 23 may be provided in each of the memory devices 24.

Then, the detected temperature of the memory device 20 and the target temperature may be compared (S130), and a temperature of the chamber 110 may be adjusted in order to compensate for a temperature difference between the detected temperature and the target temperature (S140).

Any one of an average value, a minimum value and a maximum value of the detected temperature of the memory devices 20 may be determined as a representative detected temperature. The representative detected temperature may be compared with the target temperature of the memory device 20 to determine a temperature of the chamber 110 in order to compensate for the temperature difference, and then, the temperature of the chamber 110 may be adjusted to the target temperature.

For example, an air may flow through a circulation duct 104 outside the chamber 110 using a blower fan 410, may be heated or cooled by a heater 420 or a cooler 430, and then, the heated or cooled air may be supplied to the chamber 110.

Here, temperature information within the chamber 110 may be obtained from a plurality of chamber temperature sensors 140. The temperature of the chamber 110 may be controlled based on the temperature information of the chamber 110.

For example, when a first test program of the memory devices 20 is performed, the chamber 110 may be maintained at a first temperature. When a second test program of the memory devices 20 is performed, the chamber 110 may be maintained at a second temperature different from the first temperature.

Accordingly, even when the heating value of the memory device 20 is relatively high or low according to test entries, the temperature information of the memory device 20 may be detected and then the memory device 20 may be tested at a desired target temperature.

In example embodiments, air may be sprayed out toward the memory devices (S150), e.g., through a plurality of spray holes 302 of an air spray nozzle 300 which extends in the first direction adjacent to the test sockets 210 within the chamber 110.

Accordingly, uniformity of heat convection within the chamber 110 may be improved to reduce a temperature difference between the memory devices 20.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present inventive concept. Accordingly, all such modifications are intended to be included within the scope of example embodiments as defined in the claims.

What is claimed is:

1. A test system for a memory device, comprising:
a chamber including at least one test socket column having a plurality of test sockets arranged in a first direction, wherein memory devices to be tested are in respective ones of the plurality of test sockets;
a temperature adjusting apparatus configured to supply air into the chamber according to a temperature control signal to control a temperature of the chamber;
a test device electrically connected to the plurality of test sockets and configured to test the memory devices; and
a temperature controller configured to receive temperature information of the memory devices from temperature sensors of the memory devices and to output the temperature control signal to the temperature adjusting apparatus to compensate for a temperature difference between a detected temperature of the memory devices and a target temperature,
wherein the temperature controller is further configured to output a first temperature control signal to the temperature adjusting apparatus to maintain the chamber at a first temperature when the test device performs a first test program, and the temperature controller is further configured to output a second temperature control signal to the temperature adjusting apparatus to maintain the chamber at a second temperature different from the first temperature when the test device performs a second test program different from the first test program.

2. The test system for a memory device of claim 1, wherein the temperature adjusting apparatus comprises a blower fan configured to blow the air into the chamber and a heater configured to heat the air.

3. The test system for a memory device of claim 2, wherein the temperature adjusting apparatus further comprises a cooler configured to cool the air.

4. The test system for a memory device of claim 1, further comprising:
at least one air spray nozzle extending in the first direction at a side of the at least one test socket column and having a plurality of spray holes along the first direction and configured to spray air toward the memory devices.

5. The test system for a memory device of claim 4, wherein each spray hole extends at a predetermined angle with respect to the first direction.

6. The test system for a memory device of claim 4, wherein the at least one air spray nozzle comprises at least three air spray nozzles that are spaced apart from each other in a direction perpendicular to the first direction.

7. The test system for a memory device of claim 4, wherein the at least one test socket column comprises at least first, second and third test socket columns that are spaced apart from each other in a direction perpendicular to the first direction.

8. The test system for a memory device of claim 1, wherein the chamber comprises a first sidewall having an air inlet therein and a second sidewall opposite to the first sidewall and having an air outlet therein.

9. The test system for a memory device of claim 8, wherein the chamber comprises a third sidewall connecting the first and second sidewalls and the at least one test socket column is in or on the third sidewall.

10. The test system for a memory device of claim 9, wherein the chamber is held within a housing and comprises a bottom wall connecting the first and second sidewalls, and an air duct is defined between the housing and the first sidewall, between the housing and the second sidewall, and/or between the housing and the bottom wall.

11. A test system for a memory device, comprising:
a chamber including at least one test socket column having a plurality of test sockets arranged in a first direction, wherein memory devices to be tested are in respective ones of the plurality of test sockets;
a temperature adjusting apparatus configured to supply a first air into the chamber according to a temperature control signal to control a temperature of the chamber;
at least one air spray nozzle extending in the first direction at a side of the at least one test socket column and having a plurality of spray holes along the first direction and configured to spray a second air toward the memory devices;
a test device electrically connected to the plurality of test sockets and configured to test the memory devices; and
a temperature controller configured to receive temperature information of the memory devices from temperature sensors of the memory devices and to output to the temperature adjusting apparatus the temperature control signal to compensate for a temperature difference between a detected temperature of the memory devices and a target temperature.

12. The test system for a memory device of claim 11, wherein the temperature adjusting apparatus comprises a blower fan configured to blow the first air into the chamber, a heater configured to heat the first air, and a cooler configured to cool the first air.

13. The test system for a memory device of claim 11, wherein each spray hole extends at a predetermined angle with respect to the first direction.

14. The test system for a memory device of claim 11, wherein the at least one air spray nozzle comprises at least two air spray nozzles that are spaced apart from each other in a direction perpendicular to the first direction.

15. The test system for a memory device of claim 11, wherein the temperature controller is further configured to output a first temperature control signal to the temperature adjusting apparatus to maintain the chamber at a first temperature when the test device performs a first test program, and the temperature controller is further configured to output a second temperature control signal to the temperature adjusting apparatus to maintain the chamber at a second temperature different from the first temperature when the test device performs a second test program different from the first test program.

16. A method of testing memory devices, comprising:
inserting the memory devices into respective ones of a plurality of test sockets arranged in a first direction within a test chamber;
performing a test program of the memory devices;
detecting temperature information of the memory devices from temperature sensors of the memory devices; and
adjusting a temperature of the test chamber to compensate for a temperature difference between a detected temperature of the memory devices and a target temperature,
wherein adjusting the temperature of the test chamber comprises:
flowing air through a circulation duct outside the test chamber using a blower fan;
heating or cooling the air by a heater or a cooler; and
supplying the heated or cooled air into the test chamber.

17. The method of claim 16, further comprising:
spraying air toward the memory devices through a plurality of spray holes of an air spray nozzle that extends in the first direction adjacent the plurality of test sockets within the test chamber.

18. The method of claim 16, wherein adjusting the temperature of the test chamber comprises:
maintaining the test chamber at a first temperature when a first test program of the memory devices is performed; and
maintaining the test chamber at a second temperature different from the first temperature when a second test program of the memory devices is performed.

19. The test system for a memory device of claim 11, wherein the chamber comprises a first sidewall having an air inlet therein and a second sidewall opposite to the first sidewall and having an air outlet therein.

20. The test system for a memory device of claim 19, wherein the chamber is held within a housing and comprises a bottom wall connecting the first and second sidewalls, and an air duct is defined between the housing and the first sidewall, between the housing and the second sidewall, and/or between the housing and the bottom wall.

* * * * *